United States Patent
Dixler et al.

(10) Patent No.: US 9,504,186 B2
(45) Date of Patent: Nov. 22, 2016

(54) HEATPIPE IMBEDDED COLDPLATE ENHANCING IGBT HEAT SPREADING

(71) Applicant: Caterpillar Inc., Peoria, IL (US)

(72) Inventors: Keith Elliot Dixler, Peoria, IL (US); Jon Husser, McNabb, IL (US); Todd George Nakanishi, Brimfield, IL (US)

(73) Assignee: Caterpillar Inc., Peoria, IL (US)

( * ) Notice: Subject to any disclaimer, the term of this patent is extended or adjusted under 35 U.S.C. 154(b) by 56 days.

(21) Appl. No.: 14/542,236

(22) Filed: Nov. 14, 2014

(65) Prior Publication Data

US 2016/0143186 A1    May 19, 2016

(51) Int. Cl.
| | | |
|---|---|---|
| H05K 7/20 | (2006.01) | |
| H01L 23/473 | (2006.01) | |
| H01L 23/367 | (2006.01) | |
| H01L 23/467 | (2006.01) | |

(52) U.S. Cl.
CPC ......... *H05K 7/20336* (2013.01); *H01L 23/367* (2013.01); *H01L 23/467* (2013.01); *H01L 23/473* (2013.01); *H05K 7/20254* (2013.01); *H05K 7/20963* (2013.01)

(58) Field of Classification Search
CPC .............................. G06F 1/181–1/182; H05K 7/20218–7/20381; H05K 7/20409–7/20418; H05K 7/20009–7/202; H01L 22/367–23/3677
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 5,740,015 A | * | 4/1998 | Donegan ................. | B60K 6/46 165/80.4 |
| 6,388,882 B1 | * | 5/2002 | Hoover ............... | F28D 15/0266 165/104.33 |
| 7,547,966 B2 | | 6/2009 | Funakoshi et al. | |
| 7,604,040 B2 | | 10/2009 | Ghosh et al. | |
| 7,796,389 B2 | | 9/2010 | Edmunds et al. | |
| 2003/0021089 A1 | * | 1/2003 | Belady .................. | F04D 29/681 361/695 |
| 2003/0107875 A1 | * | 6/2003 | Bijlenga ................. | H01L 24/72 361/704 |
| 2003/0227222 A1 | * | 12/2003 | Tabatowski-Bush .. | H02K 3/522 310/68 R |
| 2004/0104012 A1 | * | 6/2004 | Zhou ..................... | H01L 23/427 165/104.26 |
| 2004/0252535 A1 | * | 12/2004 | Kenny, Jr. ................. | G06F 1/26 363/144 |
| 2005/0145371 A1 | | 7/2005 | DiStefano et al. | |
| 2005/0205241 A1 | * | 9/2005 | Goodson ............... | F04B 19/006 165/80.4 |
| 2006/0007656 A1 | * | 1/2006 | Symons ................ | H01L 23/473 361/699 |
| 2006/0133041 A1 | * | 6/2006 | Belady ...................... | G06F 1/20 361/704 |
| 2006/0151146 A1 | * | 7/2006 | Chou ...................... | F28D 15/02 165/10 |

(Continued)

FOREIGN PATENT DOCUMENTS

WO    2014106051 A1    7/2014

*Primary Examiner* — Anthony Haughton
*Assistant Examiner* — Razmeen Gafur
(74) *Attorney, Agent, or Firm* — Caterpillar Inc.; James Bennin

(57) ABSTRACT

A cold plate for a power circuit is disclosed. The power circuit includes a plurality of transistors and each of the plurality of transistors includes a plurality of dies. The cold plate includes a liquid cooling system that includes a plurality of cooling channels and each of the plurality of cooling channels is aligned with at least one die. The liquid cooling system includes a heat sink associated with each of the plurality of cooling channels. The cold plate further includes a plurality of heat pipes, wherein each of the plurality of heat pipes is aligned with at least one of the plurality of cooling channels and at least one die. Each heat pipe includes a wick lining an interior of the heat pipe, a vapor flow area, and a fluid.

20 Claims, 4 Drawing Sheets

(56) References Cited

U.S. PATENT DOCUMENTS

| | | | | |
|---|---|---|---|---|
| 2006/0238984 A1* | 10/2006 | Belady | H01L 23/367 | 361/704 |
| 2008/0013277 A1* | 1/2008 | Ueda | B23K 1/0012 | 361/696 |
| 2008/0102564 A1* | 5/2008 | Sobhani | H01L 23/10 | 438/117 |
| 2008/0117593 A1* | 5/2008 | Andric | H01L 23/34 | 361/697 |
| 2008/0173024 A1* | 7/2008 | Orlowski | H05K 7/20945 | 62/3.7 |
| 2008/0259566 A1* | 10/2008 | Fried | F28D 15/0266 | 361/699 |
| 2009/0193652 A1* | 8/2009 | Salmon | G02B 6/43 | 29/831 |
| 2010/0085708 A1* | 4/2010 | Martin | H05K 7/20927 | 361/696 |
| 2010/0206537 A1* | 8/2010 | Ikeda | H01L 23/3677 | 165/185 |
| 2010/0300652 A1* | 12/2010 | Lee | G06F 1/20 | 165/80.4 |
| 2010/0309630 A1* | 12/2010 | Jones | H01L 23/467 | 361/694 |
| 2011/0042046 A1* | 2/2011 | Lehmann | H01L 23/427 | 165/104.26 |
| 2012/0087088 A1* | 4/2012 | Killion | F28D 15/0266 | 361/697 |
| 2012/0235162 A1* | 9/2012 | Isobe | H01L 23/467 | 257/77 |
| 2014/0190665 A1 | 7/2014 | Joshi et al. | | |

* cited by examiner

HEATPIPE IMBEDDED COLDPLATE ENHANCING IGBT HEAT SPREADING

TECHNICAL FIELD

The present disclosure generally relates to power circuits and, more specifically, relates to apparatus and methods for cooling power circuits.

BACKGROUND

Power circuits, such as power inverters, are often used in a variety of high powered machinery. For example, new technology involving electric drives for high-powered, heavy machinery require powerful and robust power circuits. Such power circuits may include a plurality of transistors, such as insulated-gate bipolar transistors (IGBTs), which operate to perform the desired function of the circuit.

During operation, the transistors often become very hot, which necessitates the use of systems and methods for cooling the power circuit and/or individual transistors of the circuit. The circuit may be connected to, or otherwise be operatively associated with, a cooling system which may effectively draw heat away from the power circuit. An example of such a cooling system is a cold plate. Cold plates may include a variety of known cooling elements, such as fluid cooling channels. In an example cold plate for a power circuit as shown in U.S. Pat. No. 7,796,398 ("Method and Apparatus for Cooling Electronics"), a cold plate may include one or more heat pipes for drawing heat away from the circuit towards a heat sink.

However, during certain functions of a power circuit, overall cooling may not be sufficient. One such condition is a stall condition, which may occur when the power circuit is part of an electric drive for powering a heavy machine. A stall condition exists when a machine "stalls," or ceases movement while in the middle of activity, but is still receiving power. For example, a track-type tractor may experience a stall condition when it is pushing a load that is too heavy for the drive; thusly, the machine's movement halts, or "stalls," while the drive is still operating at a high power level. Machines operating during a stall condition may put heavy strain on power circuits associated with the machine's drive, often in the form of excessive heating of power circuit elements.

During a stall condition, the entire power circuit may not experience excessive heating, but rather, a small number of transistors and/or elements of the transistor (e.g., silicon dies which comprise an IGBT) may become excessively hot. Such excessive heating of elements of a power circuit may create "hot spots" on the circuit, where unacceptable temperatures exist. Hot spots may be damaging to a circuit and lead to a lower lifespan.

SUMMARY

In accordance with one embodiment, a cold plate for a power circuit is disclosed. The power circuit may include a plurality of transistors and each of the plurality of transistors may include a plurality of dies. The cold plate may include a liquid cooling system that includes a plurality of cooling channels and each of the plurality of cooling channels is aligned with at least one die of at least one transistor. The liquid cooling system may further include a heat sink associated with each of the plurality of cooling channels. The cold plate may further include a plurality of heat pipes, wherein each of the plurality of heat pipes is aligned with at least one of the plurality of cooling channels and the at least one die. Each heat pipe may include a wick lining an interior of the heat pipe, a vapor flow area, and a fluid. In some examples, each member of the plurality of heat pipes transfer heat from a first end of the heat pipe to a second end of the heat pipe, when the first end receives a heat input. In some such examples, the fluid includes a vapor portion and a liquid portion and the heat pipe transfers heat from the first end to the second end by evaporating the liquid portion of the fluid into the vapor portion at the first end.

In accordance with another embodiment, a method for cooling a power circuit is disclosed. The power circuit may include at least one transistor and the at least one transistor may include at least one die. The method may include transferring heat from the at least one die using at least one heat pipe and the at least one heat pipe is aligned with the at least one die. The at least one heat pipe may include a wick lining an interior of the at least one heat pipe, a vapor flow area, and a fluid. The method may further include transferring heat from the at least one heat pipe to a cooling channel, the cooling channel being aligned with the at least one heat pipe and the at least one die and transferring heat from the cooling channel to a heat sink associated with the cooling channel.

In accordance with yet another embodiment, a power circuit is disclosed. The power circuit may include a plurality of transistors and each of the plurality of transistors may include a plurality of dies. The power circuit may further include a cold plate in thermal connection with the plurality of transistors. The cold plate may include a liquid cooling system that includes a plurality of cooling channels and each of the plurality of cooling channels is aligned with at least one die. The liquid cooling system may further include a heat sink associated with each of the plurality of cooling channels. The cold plate may further include a plurality of heat pipes, wherein each of the plurality of heat pipes are aligned with at least one of the plurality of cooling channels and the die. Each heat pipe may include a wick lining an interior of the heat pipe, a vapor flow area, and a fluid. In some examples, the transistors may be insulated-gate bipolar transistors (IGBTs). In some such examples, the dies may be IGBT silicon dies.

These and other aspects and features of the present disclosure will be better understood when read in conjunction with the accompanying drawings.

While the following detailed description will be given with respect to certain illustrative embodiments, it should be understood that the drawings are not necessarily to scale and the disclosed embodiments are sometimes illustrated diagrammatically and in partial views. In addition, in certain instances, details which are not necessary for an understanding of the disclosed subject matter or which render other details too difficult to perceive may have been omitted. It should therefore be understood that this disclosure is not limited to the particular embodiments disclosed and illustrated herein, but rather to a fair reading of the entire disclosure and claims, as well as any equivalents thereto.

DETAILED DESCRIPTION

The present disclosure provides apparatus and methods for cooling a power circuit. In some examples, the disclosed apparatus and methods may be useful in spreading heat among elements of a power circuit and/or dissipating heat towards a heat sink. The disclosed systems and methods may be especially useful when operating conditions of a machine, with which a power circuit is associated, enters a condition which produces hot spots on the circuit.

Figure 1:
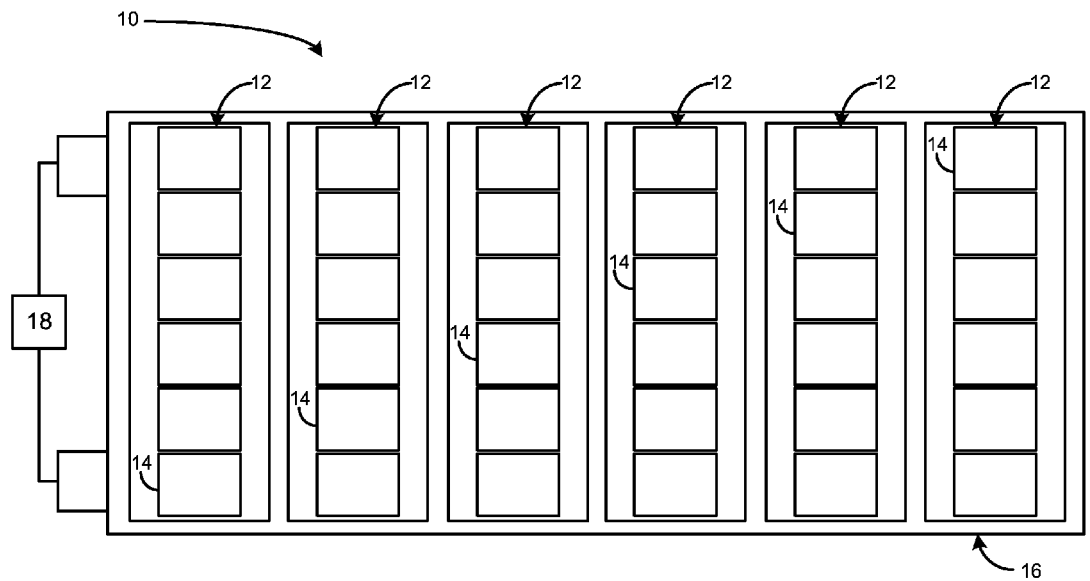
FIG. 1 is an overhead schematic view of a power circuit in accordance with the present disclosure.

Turning now to the drawings and with specific reference to FIG. 1, schematic diagram of a power circuit 10 is shown from an overhead perspective. The power circuit 10 may be a power inverter or any other type of power circuit involving a plurality of transistors 12. The transistors 12 may be any kind of transistor suitable for a power circuit and may be, but are not limited to being, insulated-gate bipolar transistors (IGBTs). Further, each one of the transistors 12 include a plurality of dies 14. In an example, wherein the transistors 12 are IGBTs, the pluralities of dies 14 may be silicon dies.

While the example power circuit 10 shows six transistors 12 in a particular alignment, the power circuit 10 is not limited to having six transistors 12 and may include any number of transistors 12 in any suitable alignment. Further, while each of the transistors 12 is shown having six dies 14, the transistors 12 are not limited to having six dies 14 and may have any number of dies 14 in any suitable arrangement.

The power circuit 10 is operatively associated with a cold plate 16. As such, the power circuit 10 may be mounted or otherwise connected to the cold plate 16. The cold plate 16 may be provided to cool the transistors 12 and their respective dies 14. As such, the cold plate 16 may be thermally connected to the transistors 12 and their respective dies 14. By cooling the transistors 12 and their respective dies 14, the cold plate 16 may spread heat from "hot" transistors 12 and/or dies 14 to other "cold" transistors 12 and/or dies 14. Further, heat transferred by the cold plate 16 may be dissipated away from the power circuit 10 via a heat sink 18. If a machine, with which the power circuit 10 is associated, exhibits a stall condition, one or more dies 14 of one or more transistors 12 may become particularly heated. In such situations, the cold plate 16 is useful for spreading the excess heat from the individually overheated dies 14 and/or transistors 12 amongst colder elements of the power circuit 10.

Figure 2:
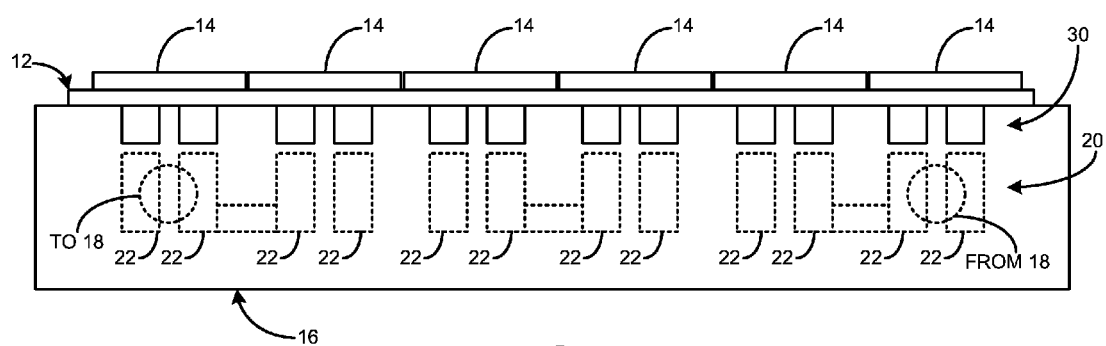
FIG. 2 is a schematic cross-sectional view of a cold plate in association with the power circuit of FIG. 1, in accordance with the present disclosure.

Components of the cold plate 16 are shown in a cross sectional view of the cold plate 16 in FIG. 2. The cold plate includes a liquid cooling system 20, the liquid cooling system 20 including a plurality of cooling channels 22. In some examples, the cooling channels 22 are designed to have an adequate volume to withstand debris (e.g., preventing clogging of the cooling channels 22 by said debris) that may enter the cold plate during machine use. The cooling channels 22 are each located directly in alignment with at least one die 14 of a transistor 12 of the power circuit 10. The surface and internal structural materials of the cold plate 16 which surround the coolant channels may be made of any suitable material for a cold plate, such as, but not limited to, aluminum.

Figure 3:
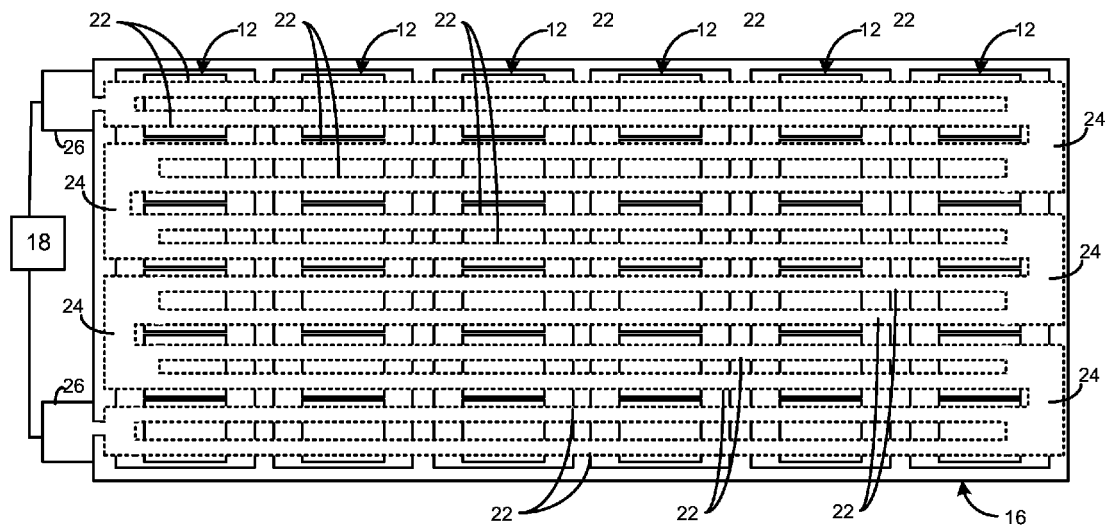
FIG. 3 is a schematic view of the cold plate and power circuit of FIGS. 1 and 2 as viewed from the bottom of the cold plate, in accordance with the present disclosure.

Turning now to FIG. 3, and with continued reference to FIGS. 1 and 2, a schematic view of the cold plate 16 and the associated power circuit 10, as viewed from the from the bottom of the cold plate 16, is shown. The individual cooling channels 22 of the liquid cooling system 20 are located under, and in alignment with, the pluralities of dies 14 of the transistors 12. Being directly in alignment with a die 14 allows the cooling channels 22, and the liquid cooling system 20 as a whole, to divert heat from dies which may be hot. For example, if a die 14 is heated to the point where it becomes a hot spot, the liquid coolant may divert the heat from the hot spot and may, ultimately, route the heat towards the heat sink 18.

In the present example of FIGS. 2 and 3, twelve cooling channels are shown. However, the liquid cooling system 20 is not limited to having twelve cooling channels and may have any number of cooling channels 22 directly aligned with any number of dies 14 of any number of transistors 12. Further, while the liquid cooling system 20 shows the cooling channels 22 all interconnected by a plurality of end channels 24, the cooling channels 22 need not all be interconnected. While the liquid cooling system 20 is shown to enter/exit the heat sink 18 via the two terminals 26, the cooling system may include any number of terminals entering/exiting any number of heat sinks 18.

Returning now to FIG. 2, the cold plate 16 includes a plurality of heat pipes 30. The plurality of heat pipes 30 are positioned between the liquid cooling system 20 and the power circuit 10. As such, the liquid cooling system 20 may be situated directly below the plurality of heat pipes 30. Each of the plurality of heat pipes 30 are directly aligned with at least one die 14 of at least one transistor 12. The heat pipes 30 are aligned with the dies 14 in a similar manner to that of the cooling channels 22 of the liquid cooling system 20. As such, the heat pipes may also be in direct alignment with respective cooling channels 22 of the liquid cooling system 20 in addition to being in alignment with the dies 14. Further, the heat pipes 30 may be arranged substantially parallel to the cooling channels 22 of the liquid cooling system 20.

Figure 4:
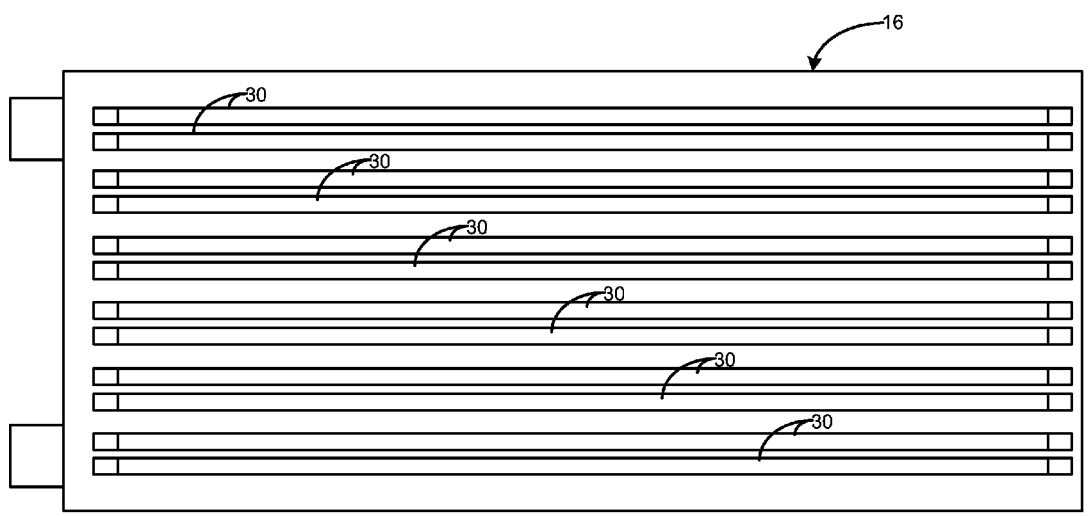
FIG. 4 is a schematic diagram of a top portion of the cold plate of FIGS. 1-3 having a plurality of heat pipes, in accordance with the present disclosure.
Figure 5:
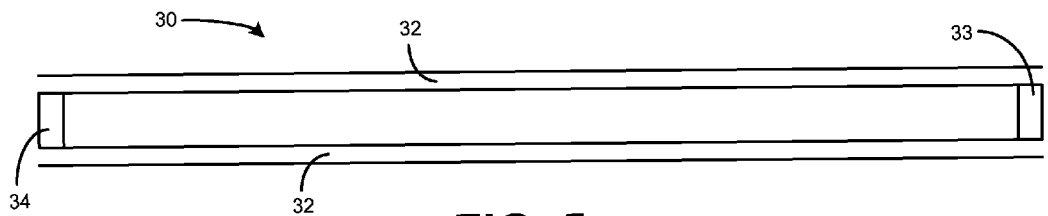
FIG. 5 is a schematic diagram of an example heat pipe of the plurality of heat pipes of FIG. 4, in accordance with the present disclosure.
Figure 6:
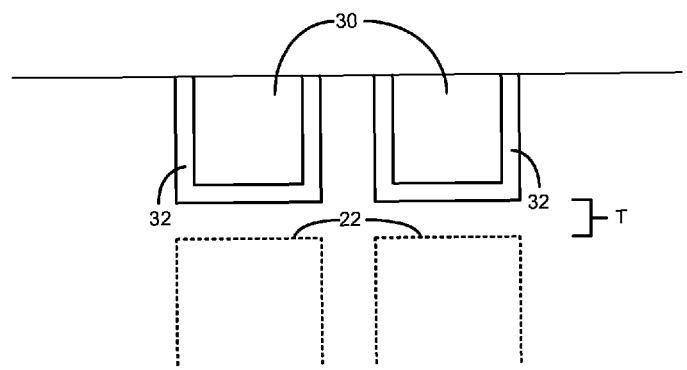
FIG. 6 is a magnified cross sectional view of a portion of the cold plate of FIGS. 1-5, in accordance with the present disclosure.

FIG. 4 shows a top schematic view of the cold plate 16. The heat pipes 30 may be in parallel alignment with both the dies 14 and the cooling channels 22 of the liquid cooling system 20. FIG. 5 shows an example heat pipe 30 in greater detail. To imbed the heat pipes 30, while maintaining positioning with respect to the dies 14, and/or to otherwise fasten each heat pipe 30 to the cold plate 16, each heat pipe may be sealed to and/or within the cold plate 16. This may be performed using a thermal adhesive 32, which is shown being applied to, for example, three sides of the heat pipe. The three sides of the heat pipe 30 on which the thermal adhesive 32 may be applied are seen in FIG. 6. Such a manner of sealing with the thermal adhesive 32 may, thusly, leave the top of the heat pipe 30 to be operatively adjacent to the dies 14 for thermal connectivity.

Further, the magnified cross-sectional view of the cold plate 16 in FIG. 6 shows a thickness T between the cooling channels 22 and the heat pipes 30. The thickness T may be designed to be very small, so as to further encourage heat transfer from the dies 14, to the heat pipes 30, to the cooling channels 22, and ultimately to the heat sink 18. For example, if the cold plate is approximately 50 millimeters (mm) thick and the heat pipes 30 are approximately 10 mm thick, an ideal thickness T between the heat pipes 30 and the cooling channels 22 may be between approximately 2-5 mm, although, of course, this is only exemplary, and not limiting.

Figure 7:
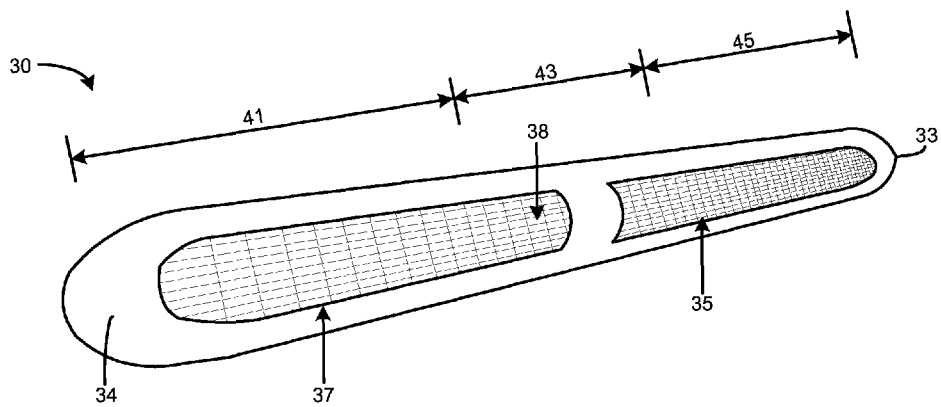
FIG. 7 is a partially sectioned perspective view of an example heat pipe, in accordance with the present disclosure.

Turning now to FIG. 7, a cross sectional perspective view of an example heat pipe 30 is shown. The heat pipe 30 may be filled with fluid, in both a pure liquid form and a pure vapor form of said fluid. For example, the fluid may include a methanol-based fluid, which has a low boiling point, and/or the fluid may include a water-based fluid. In the present example, the heat pipe 30 has a first end 33 and a second end 34. In an example embodiment, heat may be input to the heat pipe 30 (for example, by contact with a die 14 which is hot) at the first end 33. Input of the heat may evaporate part of the liquid portion of the internal fluid of the heat pipe 30. The liquid that is evaporated may be contained in a wick 35, which lines the interior of the heat pipe 30 adjacent to an outer shell 36 of the heat pipe 30. The liquid may flow along the wick at a liquid flow portion 37. Vapor portions of the fluid may be contained in a vapor flow area 38.

In an example wherein heat enters the heat pipe 30 at the first end 33, the heat pipe 30, functionally, is divided into condensation section 41, adiabatic section 43, and evaporation section 45. When heat is input at the first end, the heat that is input evaporates liquid stored in the wick 35 into the vapor flow area 38. To remove heat, the vapor in the vapor flow area 38 travels down the adiabatic section 43 to reach the condensation section 41. At the condensation section 41, the vapor condenses into liquid and recedes, or soaks into, the wick 35. Surface tension on the liquid in the wick 35 pulls the liquid through the wick from the condensation section 41, through the adiabatic section 43, and to the evaporation section 45. There, the liquid can be evaporated into vapor to further transfer heat from the first end 33 to the second end 34.

INDUSTRIAL APPLICABILITY

The present disclosure generally relates to power circuits and, more specifically, relates to apparatus and methods for cooling power circuits. The provided cold plates, power circuits, and methods provide enhanced heat spreading for a power circuit.

Figure 8:
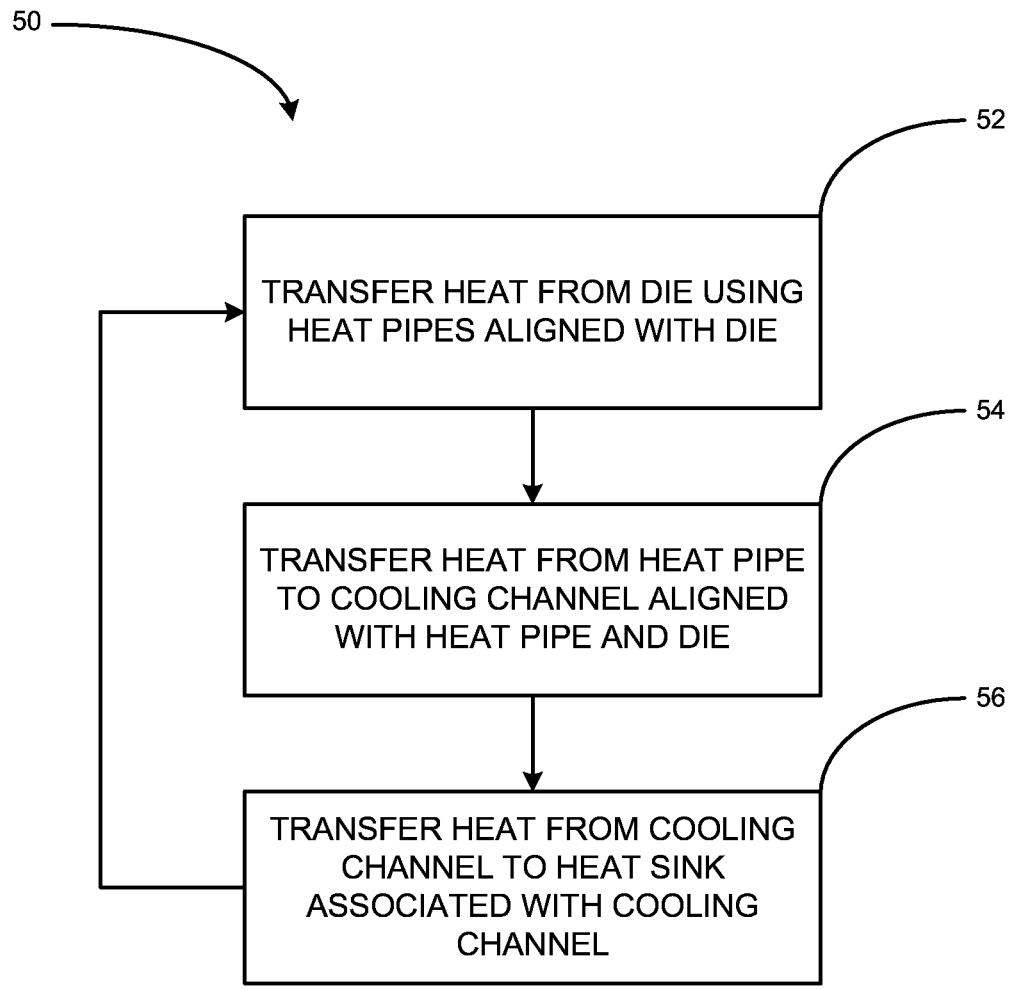
FIG. 8 is a flow chart showing an example method for cooling a power circuit, in accordance with the present disclosure.

For example, FIG. 8 shows a flowchart for a method 50 for cooling the power circuit 10 using the cold plate 16. At block 52, the heat pipes 30 transfer heat from at least one of the plurality of dies 14. Transferring heat from the dies 14 using the heat pipes 30 may include transferring heat from the first end 33 to the second end 34 by evaporating the liquid portion of the fluid into the vapor portion at the first end 33. The heat in the heat pipes 30 may then be transferred to the cooling channels 22 of the liquid cooling system 20 (block 54). Further, the liquid cooling system 20 may then transfer heat to the heat sink 18 (block 56).

Using the liquid cooling system 20, in combination and alignment with the heat pipes, may allow for heat to be spread from one element of a circuit (e.g., a hot die 14) to other elements of the circuit to distribute power in a manner that may preserve life of the circuit. For example, the systems and methods may prevent hot spots on dies from occurring when an associated machine exhibits a stall condition, as discussed above. Often, a cooling system, such as the cold plate 16, may be designed to properly cool a circuit based on conditions that occur during a stall condition. The disclosed apparatus and methods provide greater heat transfer and spreading during such stall conditions. Providing such improved heat transfer spreading may prolong the life of the circuit and/or prevent damage from hot elements of the circuit.

It will be appreciated that the present disclosure provides apparatus and methods for cooling power circuits. While only certain embodiments have been set forth, alternatives and modifications will be apparent from the above description to those skilled in the art. These and other alternatives are considered equivalents and within the spirit and scope of this disclosure and the appended claims.

What is claimed is:

1. A cold plate for a power circuit, the power circuit including a plurality of transistors, each transistor of the plurality of transistors including a plurality of dies, the cold plate comprising:
   a liquid cooling system,
      the liquid cooling system including a plurality of cooling channels,
      each of the plurality of cooling channels being aligned with at least one die of the plurality of dies, and
      a heat sink associated with each of the plurality of cooling channels; and a plurality of heat pipes,
      at least one of the plurality of heat pipes being aligned, substantially in parallel, with at least one of the plurality of cooling channels and at least one die of the plurality of dies,
      each of the plurality of heat pipes including a wick lining an interior of the heat pipe, a vapor flow area, and a fluid.

2. The cold plate of claim 1, wherein the plurality of transistors are thermally connected to the cold plate and the plurality of heat pipes are in adjacent thermal connection to the plurality of dies.

3. The cold plate of claim 2, wherein the plurality of cooling channels are located directly below the plurality of heat pipes and the plurality of cooling channels and plurality of heat pipes are separated by a volume of materials having a thickness T.

4. The cold plate of claim 3, wherein the thickness T is approximately 2-5millimeters (mm).

5. The cold plate of claim 1, wherein each heat pipe, of the plurality of heat pipes, transfers heat from a first end of the heat pipe to a second end of the heat pipe,
   the first end receiving a heat input.

6. The cold plate of claim 5, wherein the fluid includes a vapor portion and a liquid portion, and
   wherein the heat pipe transfers heat from the first end to the second end by evaporating the liquid portion of the fluid into the vapor portion at the first end.

7. The cold plate of claim 1, wherein the fluid includes at least one of a methanol-based liquid or a water-based liquid.

8. The cold plate of claim 1, wherein each of the plurality of heat pipes are fastened using a thermal adhesive.

9. The cold plate of claim 1, wherein each heat pipe, of the plurality of heat pipes, is arranged substantially parallel to the plurality of cooling channels.

10. A method for cooling a power circuit, the power circuit including at least one transistor, the at least one transistor including at least one die, the method comprising:

transferring heat from the at least one die using at least one heat pipe,
  the at least one heat pipe being aligned, substantially in parallel, with the at least one die,
  the at least one heat pipe including a wick lining an interior of the at least one heat pipe, a vapor flow area, and a fluid;
transferring heat from the at least one heat pipe to a cooling channel,
  the cooling channel being aligned with the at least one heat pipe and the at least one die; and
transferring heat from the cooling channel to a heat sink associated with the cooling channel.

11. The method of claim 10, wherein the power circuit is associated with a machine, and
  wherein the at least one die is a die producing excess heat due to the machine operating during a stall condition.

12. The method of claim 10, wherein the at least one heat pipe transfers heat from a first end of the at least one heat pipe to a second end of the at least one heat pipe,
  the first end receiving a heat input from the at least one die.

13. The method of claim 10, wherein transferring heat from the at least one die using the at least one heating pipe includes:
  transferring heat from a first end of the at least one heat pipe to a second end of the at least one heat pipe by evaporating a liquid portion of the fluid into a vapor portion at the first end.

14. The method of claim 10, wherein the at least one heat pipe is arranged substantially parallel to the cooling channel.

15. A power circuit, comprising:
  a plurality of transistors,
    each transistor, of the plurality of transistors, including a plurality of dies; and
  a cold plate in thermal connection with the plurality of transistors, the cold plate including:
    a liquid cooling system,
      the liquid cooling system including a plurality of cooling channels,
      each cooling channel, of the plurality of cooling channels, being aligned with a respective at least one die of the plurality of dies, and a heat sink associated with each cooling channel of the plurality of cooling channels; and
    a plurality of heat pipes,
      each heat pipe of the plurality of heat pipes being aligned, substantially in parallel, with at least one of the plurality of cooling channels and the respective at least one die of the plurality of dies,
      each heat pipe of the plurality of heat pipes including a wick lining an interior of the heat pipe, a vapor flow area, and a fluid.

16. The power circuit of claim 15, wherein the plurality of transistors are a plurality of insulated-gate bipolar transistors (IGBTs).

17. The power circuit of claim 16, wherein the plurality of dies are a plurality of IGBT silicon dies.

18. The power circuit of claim 15, wherein the plurality of cooling channels are located directly below the plurality of heat pipes, and
  wherein the plurality of cooling channels and plurality of heat pipes are separated by a volume of materials having a thickness T.

19. The power circuit of claim 15, wherein each of the plurality of heat pipes transfer heat from a first end of the heat pipe to a second end of the heat pipe,
  the first end receiving a heat input.

20. The power circuit of claim 19, wherein the fluid includes a vapor portion and a liquid portion, and
  wherein the heat pipe transfers heat from the first end to the second end by evaporating the liquid portion of the fluid into the vapor portion at the first end.

* * * * *